United States Patent [19]

Suzuki

[11] 4,372,046

[45] Feb. 8, 1983

[54] METHOD OF MAKING A SWITCHING ELECTRODE PORTION OF A PCB

[75] Inventor: Keiichi Suzuki, Tokyo, Japan

[73] Assignee: Kabushiki Kaisha Daini Seikosha, Japan

[21] Appl. No.: 195,930

[22] Filed: Oct. 10, 1980

Related U.S. Application Data

[63] Continuation-in-part of Ser. No. 935,097, Aug. 21, 1978, abandoned.

[30] Foreign Application Priority Data

Aug. 24, 1977 [JP] Japan .......................... 52-113129[U]

[51] Int. Cl.³ ............................................. H01K 3/10
[52] U.S. Cl. ........................................ 29/852; 29/413;
29/426.1; 29/846; 174/68.5
[58] Field of Search ...................... 29/846, 852, 426.1,
29/830, 426.4, 426.5, 825, 592 E, 413; 174/68.5;
339/17 CF, 17 L

[56] References Cited

U.S. PATENT DOCUMENTS 2,926,340 2/1960 Blain et al. .......................... 29/830 X
3,531,581 9/1970 Chesemore .......................... 174/68.5
3,780,431 12/1973 Feeney ............................ 174/68.5 X
3,964,087 6/1976 Mallon ............................ 174/68.5 X

OTHER PUBLICATIONS

IBM Tech Discl Bull., vol. 5, No. 5, Oct. 1962, p. 24, by S. M. Meiboom.

*Primary Examiner*—Francis S. Husar
*Assistant Examiner*—Carl J. Arbes
*Attorney, Agent, or Firm*—Robert E. Burns; Emmanuel J. Lobato; Bruce L. Adams

[57] ABSTRACT

A circuit board, for an electronic timepiece, having a switching electrode formed on a narrow peripheral surface of the circuit board. The narrow peripheral surface has a pair of spaced indentations, and the switching electrode is comprised of a metallic layer disposed on the indentation surfaces and on the portion of the narrow peripheral surface between the indentations. The switching electrode is fabricated by forming a pair of spaced small holes through a circuit board base plate, and by forming a large hole having a diameter greater than a distance between the pair of small holes and positioned for intersecting the pair of small holes. A conductive layer is plated on the surfaces defining the pair of small holes and on that portion of the surface which defines the large hole that is between the pair of small holes. The final shape of the circuit board is then press cut from the circuit board base plate along a line of cutting which passes through the pair of small holes and the large hole so that the conductive layer is disposed on a portion of the narrow peripheral surface of the finished circuit board having a pair of indentations corresponding to the pair of small holes, and the conductive layer defines a switching electrode.

7 Claims, 7 Drawing Figures

METHOD OF MAKING A SWITCHING ELECTRODE PORTION OF A PCB

This application is a continuation-in-part of Ser. No. 935,097 filed Aug. 21, 1978, now abandoned.

BACKGROUND OF THE INVENTION

The present invention relates to a switching electrode portion of a circuit board for an electric watch. The invention also relates to a method of fabricating the switching electrode portion of the circuit board.

Electronic timepieces generally include a circuit board comprised of a base plate and metallic conductive circuit patterns formed thereon. Frequently, a switching electrode comprised of a conductive metallic layer will be formed on a narrow peripheral surface portion of the circuit board.

One technique for fabricating a switching electrode on an electronic timepiece circuit board includes forming a hole through a base plate of a circuit board, before the circuit patterns are formed. Next, metallic conductive material is plated through the hole. Finally, the base plate is cut in the final shape of the circuit board, and the line of cutting passes through the plated hole. The resulting circuit board therefore has a peripheral surface portion carrying a portion of the metallic conductive layer plated through the hole through the circuit board for defining a switching electrode.

One limitation of the prior art technique results when the cutting step is performed by press cutting. A cutting die used for press cutting causes the conductive metallic layer defining the switching electrode to lift off the circuit board base plate at the edges of the electrode. This is a serious problem since the portion of the electrode which lifts off the circuit board base plate may touch a switch and therefore cause faulty operation of the timepiece.

SUMMARY OF THE INVENTION

It is therefore an object of the invention to provide a new and improved switching electrode for use in electronic timepieces.

It is another object of the invention to provide a switching electrode which can be manufactured without damage to the final electrode structure.

It is another object of the invention to provide a switching electrode on an electronic timepiece circuit board which may be manufactured without causing the electrode to separate from the circuit board on which the electrode is formed.

It is still another object of the present invention to provide a method of fabricating a switching electrode for an electronic timepiece which allows the electrode to be fabricated undamaged.

Still another object of the present invention is to provide a method of manufacturing a switching electrode for an electronic timepiece which results in a reliable electrode which is not subject to faulty operation.

The method according to the present invention of forming an electrode on a peripheral surface portion of a circuit board comprises providing a base plate for a circuit board having a pair of major surfaces and a narrow peripheral surface extending between the pair of major surfaces. Two small holes spaced a distance from each other are formed through the base plate, and each of the two small holes extends between the pair of major surfaces of the base plate. Subsequently, a large hole, having a diameter greater than the distance between the two small holes, is formed through the base plate and is formed so as to intersect the two small holes. The surfaces of the base plate defining the hole resulting from the intersection of the large hole and the two small holes formed in the base plate are next plated with a conductive metallic layer. The conductive metallic layer defines an electrode. Finally, a portion of the base plate opposite the conductive layer is removed by cutting the base plate along an imaginary line through the two small holes, so that the surface portion on the base plate on which the conductive layer is plated is a peripheral surface portion of the base plate. The conductive layer remaining on the peripheral surface portion of the base plate defines an electrode on the peripheral surface portion of the base plate.

The method according to the present invention may advantageously include additional steps for forming circuit patterns on the base plate so that a circuit board is fabricated while the switching electrode is being formed. Consequently, the resulting article is a completed circuit board including a switching electrode on a narrow peripheral surface portion thereof. To this end, the step of providing a base plate includes providing a base plate having a pair of major surfaces, each having a conductive metallic layer disposed thereon. And the method according to the invention includes a step of selectively removing portions of the metallic layers to define circuit patterns with the unremoved portions of the metallic layers.

The single hole through the circuit board base plate defined by the intersection of the two small holes and the large hole having a diameter greater than the distance between the two small holes is defined by a surface extending between the major surfaces of the base plate, generally having the shape of the large hole, and having a pair of indentations corresponding to the two small holes. The step of removing a portion of the base plate opposite the metallic layer defining the switching electrode comprises press cutting the base plate along an imaginary line through the single hole and spaced from the portion of the surface defining a single hole having the pair of indentations so that the surface having the pair of indentations becomes a narrow peripheral surface portion of the circuit board, and the conductive material thereon defines the switching electrode.

The circuit board according to the present invention has a pair of major surfaces and a narrow peripheral surface extending between the pair of major surfaces. A pair of recesses are formed in the narrow peripheral surface of the circuit board, and each recess extends between the pair of major surfaces of the circuit board and the recesses are spaced apart from each other. The portion of the narrow peripheral surface between the pair of recesses terminates spaced back from an imaginary line extending between respective remote edges of the pair of recesses and each of the recesses have a respective curvature effective to define an angle greater than an acute angle between the surface defining the recess and the narrow peripheral surface of the circuit board, at both the respective remote edges of the pair of recesses. A conductive layer is disposed within the pair of recesses and on the portion of the narrow peripheral surface between the pair of recesses for defining a switching electrode.

BRIEF DESCRIPTION OF THE DRAWINGS

Other objects, advantages and features of the electrode structure and method of fabricating same, according to the present invention, are described below in conjunction with the accompanying drawings in which.

DESCRIPTION OF THE PREFERRED EMBODIMENTS

Before describing the preferred embodiments of the present invention it will be useful to consider conventional switching electrodes in order to fully appreciate the advantages of the switching electrode according to the present invention.

Figure 1:
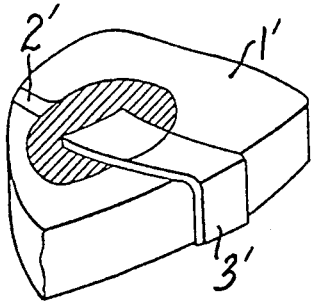
FIGS. 1 and 2 are perspective views of prior art switching electrodes.

FIG. 1 illustrates conventional switching electrode structure formed on a circuit board 1'. The switching electrode is comprised of a conductive layer 2' to which electrical connection is made by a small metallic plate 3'. Because the switching electrode 2' is very small, the metallic plate 3' is required to be extremely small and must be very precisely positioned and fixed on the circuit plate 1'. Thus, a miniature switching electrode having the conventional structure illustrated in FIG. 1 is difficult and expensive to fabricate.

The number of switches, and hence switching electrodes, required in an electronic timepiece increases in proportion to the number of timepiece functions. Therefore, the cost of switching electrodes in a multiple-function timepiece increases as the number of timepiece functions increases.

Figure 2:
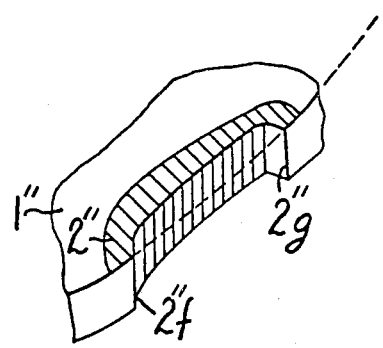

In order to eliminate the cost increase attendant the use of the prior art switching electrode structure illustrated in FIG. 1 of the drawings, it was suggested that the metallic plate 3' be eliminated and the switching electrode be formed on the narrow peripheral surface portion of a circuit board. This structure is illustrated in FIG. 2 of the drawings wherein a circuit board 1'' has a switching electrode 2'' formed on a narrow peripheral surface portion of the circuit board 1''. In this structure, the switching electrode 2'' is formed before the circuit board 1'' is formed in its final shape. Then, the circuit board 1'' is cut to its final shape. In FIG. 2 the line of cutting is illustrated by a dashed line.

A practical problem arises when press cutting is used for cutting the circuit board 1'' to its final shape. During press cutting the switching electrode, at its remote edge portions 2''f, 2''g, separates from the underlying circuit board 1''. When this occurs, the switching electrode may separate and lift so far off the circuit board that it contacts associated timepiece switch structure (not shown) opposite the switching electrode and thereby cause faulty operation. Thus, the switching electrode structure illustrated in FIG. 2 of the application, although desirable from a standpoint of simplicity and low manufacturing cost, is unable, in practice, to reliably deliver fault-free operation.

Figure 3:
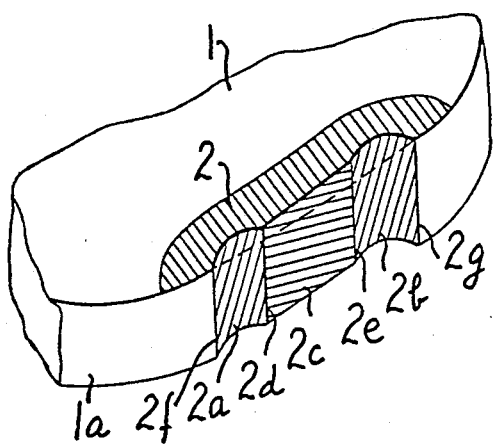
FIG. 3 is a perspective view of a portion of a circuit board incorporating the switching electrode according to the present invention.

As shown in FIG. 3, according to the present invention a circuit board 1 has a switching electrode 2 formed on a narrow peripheral surface 1a thereof. The switching electrode has a pair of indentations 2a, 2b formed therein and spaced apart from each other. In the preferred embodiment the indentations 2a, 2b extend between the pair of major surfaces of the circuit board 1. A portion 2c of the switching electrode extends between the indentations 2a, 2b and the electrode portion 2c on the narrow peripheral surface 1a of the circuit board 1 terminates at respective edges 2d, 2e adjacent the respective notches 2a, 2b.

The final shape of the circuit board 1 is press cut along an imaginary line depicted in FIG. 3 by a dash line. Press cutting occurs along the imaginary line spaced away from the electrode portion 2c and which intersects the indentation surfaces 2a, 2b at the respective remote edges 2f, 2g thereof.

Figure 4:
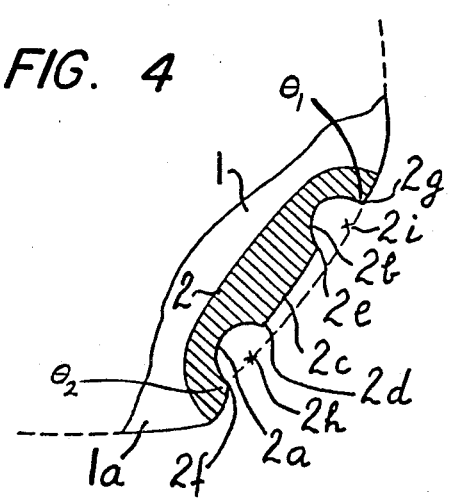
FIG. 4 is a plan view of a portion of a circuit board illustrated in FIG. 3 and incorporating the switching electrode according to the present invention.

An important feature of the present invention which prevents the electrode layer from lifting off the circuit board 1, after the circuit board 1 has been press cut to its final shape, is illustrated in FIG. 4. The indentation surfaces 2a, 2b intersect the narrow peripheral surface of the circuit board 1 at respective remote edges 2f, 2g at respective angles $\theta 1$, $\theta 2$ which are both greater than acute angles. As a consequence, the conductive layer portion 2c defining the electrode will not separate and lift from the circuit board, and at most only the conductive layer portions on the indentation surfaces 2a, 2b can separate from the circuit board. Consequently, the conductive electrode layer cannot separate to such an extent as to cause faulty operation.

Figure 5:
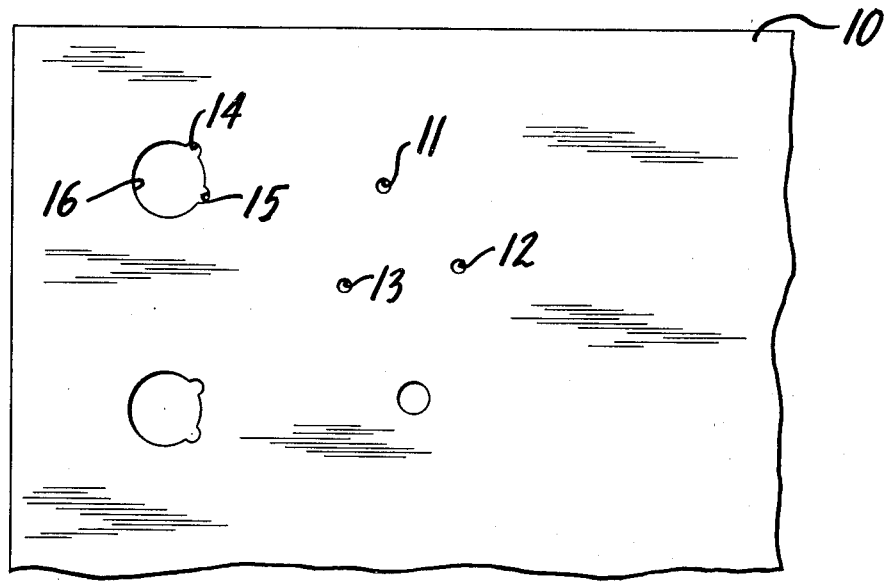
FIG. 5 is a plan view of a circuit board base plate having holes therethrough formed during the fabrication of a circuit board incorporating the switching electrode according to the present invention.
Figure 6:
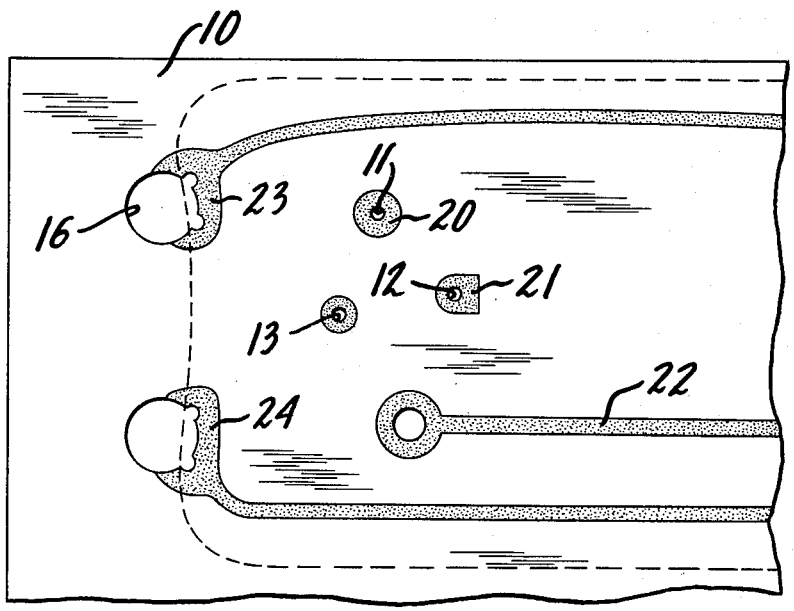
FIG. 6 is a plan view of a circuit board base plate having holes therethrough and conductive metallic circuit patterns formed during the fabrication of a circuit board incorporating the switching electrode according to the present invention.

The method according to the present invention for fabricating the structure previously described is illustrated in FIGS. 5 and 6, and comprises providing a base 10 for a circuit board having a pair of opposed major surfaces. According to a preferred embodiment of the method according to the invention, the base 10 for the circuit board has a pair of metallic layers such disposed on a respective major surface of the base.

Holes, for example, 11, 12, 13, are formed through the circuit board base and extend between the pair of major surfaces of the base. The positions of these holes will depend upon the particular circuit pattern which will be formed on the circuit board base. The holes formed include a pair of holes which are spaced a certain distance, and each of which are defined by a respective surface 14, 15 extending through the base between the major surfaces of the base. A large hole having a diameter greater than the distance between the small holes is formed at a position so that the surface 16 defining the large hole having the diameter greater than the distance between the two hole surfaces 14, 15 intersects the respective surfaces 14, 15 so as to form a single hole. The single hole is defined by a surface extending through the circuit board base 10 and extending between the pair of major surfaces of the base 10. The surface defining the single hole is comprised of the intersection of the surface 16 defining the large diameter hole and the surfaces 14, 15 defining the pair of small holes. The surfaces 14, 15 define a pair of indentations in the surface 16.

Subsequently, the entire surface of the circuit board base is covered with a conductive layer. The circuit board base surface covered includes the surfaces 11-16 defining the various holes through the base 10. A non-electric field plating technique is used, and this step is referred to as through hole plating.

After the plating operation portions of the plated material, and portions of the metallic layers originally on the circuit board base, are selectively removed. This selective removal may be carried out by etching, and the portions of conductive layers remaining, after etching, define desired circuit patterns. Examples of circuit patterns formed by the selective removal of the conductive material on the circuit board base are indicated by reference numerals 20-22 in FIG. 6.

Additionally, portions of the conductive metallic layer on the circuit board base are left adjacent and on the surfaces 14 and 15, and adjacent and on the portion of the surface 16 between the surfaces 14 and 15. These portions 23, 24 of the conductive layer will comprise the switching electrodes when the fabrication of the circuit board is complete.

After etching, gold, or another metallic element, is plated on the remaining electrode patterns. This plating may be by electrolytic plating. Finally, the circuit board is cut from the circuit board base 10 in its final shape. The cutting is along an imaginary line represented by dashed lines in FIG. 6. The line of cut extends through the indentations defined by surfaces 14, 15 and opposite the portion of the surface 16 between the indentations. After cutting, the surfaces 14, 15 and the remaining portion of the surface 16 are portions of the narrow peripheral surface of the circuit board, and the remaining metallic layer portions 23, 24 define switching electrodes on the narrow peripheral surface of the circuit board.

An important aspect of the present invention is that the cutting of the circuit board base to the final shape of the circuit board is done by press cutting. Press cutting can be utilized in practicing the present invention because the electrode according to the present invention can be press cut without damage to the electrode structure, and more particularly, without causing the conductive electrode layer to separate and lift from the circuit board. Moreover, the cutting die used for cutting the circuit board to its final shape may itself have a simple shape, because the complex electrode shape of the switching electrode on the peripheral surface of the circuit board is not formed by the cutting die.

Figure 7:
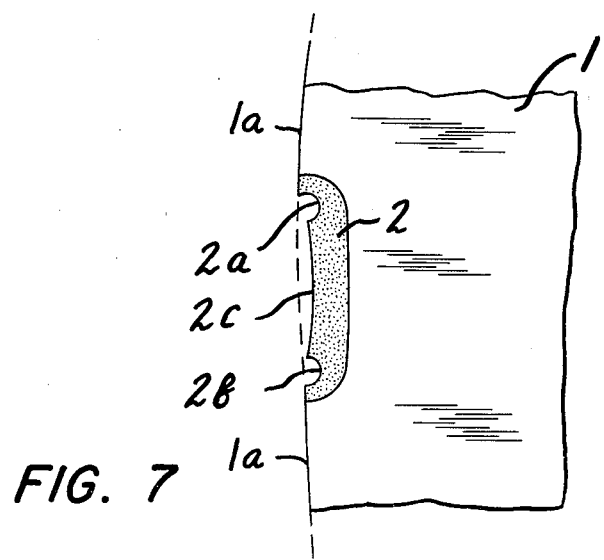
FIG. 7 is a plan view of a portion of a circuit board fabricated from the circuit board base plate illustrated in FIG. 6 and incorporating the switching electrode according to the present invention.

FIG. 7 illustrates a portion of the circuit board 1 having the switching electrode fabricated by the method according to the present invention. The switching electrode 2 is comprised of a conductive metallic layer overlying peripheral surface portions 2a, 2b, 2c of the circuit board 1 which respectively correspond to the indentation surface 14, 15 and the portion of the large hole surface 16 between the indentation surfaces 14, 15. The peripheral surface portions 2a and 2b are the remainder of the surfaces 14, 15 which defined the pair of small holes through the circuit board base. The surface portion 2c is the remainder of the surface 16 which defined the large diameter hole which was formed so as to intersect the pair of small diameter holes. As can be seen from FIG. 7, the switching electrode 2 is set back from the line of cut, depicted by the dashed line, along which the final shape of the circuit board was cut. The line of cut is selected so that indentations respectively defined by surface portions 2a, 2b define an angle, greater than an acute angle, with the narrow peripheral surface 1a of the circuit board 1. Thus, the resulting switching electrode has the features of the present invention resulting in an electrode which can be fabricated on a circuit board having a final shape formed by press cutting, and which will not be damaged by the press cutting operation.

What I claim is:

1. A method of forming an electrode on a peripheral surface portion of a circuit board, comprising:

providing a base plate for a circuit board having a pair of major surfaces and a narrow peripheral surface extending between said pair of major surfaces;

forming through said base plate two small holes spaced a certain distance from each other and each extending between the pair of major surfaces of said base plate;

forming through said base plate a large hole having a diameter greater than the distance between the two small holes and which intersects the two small holes;

plating with a conductive layer inner surfaces of said base plate defining the two small holes and only that portion of the surface of said base plate defining the large hole which is between the two small holes, wherein said conductive layer defines an electrode; and removing the portion of said base plate containing the unplated portion of said large hole opposite said conductive layer so that the surface portion of said base plate on which said conductive layer is plated is a peripheral edge portion of said base plate and said conductive layer defines an electrode on a peripheral edge portion of said base plate.

2. A method of forming an electrode on a peripheral edge portion of a circuit board, comprising:

providing a base plate for a circuit board having a pair of opposed major surfaces;

forming through said base plate two holes spaced a certain distance, each of said holes being defined by a respective surface extending through said base plate between the opposed major surfaces of said base;

forming through said base plate a hole having a diameter greater than the distance between the two small holes and at a position so that the distance defining the hole having the diameter greater than the distance between the two holes intersects the respective surfaces defining the two holes so as to form a single hole;

plating with a conductive layer the portion of the surface defining the single hole through said base plate including the portions of the surfaces defining the pair of holes and the surface portion therebetween, wherein said conductive layer defines an electrode; and removing the portion of said base plate containing the unplated portion of said large hole opposite said conductive layer so that the surface portion of said base plate on which said conductive layer is plated is a peripheral surface portion of said base plate, and said conductive layer defines an electrode on a peripheral surface portion of said base plate.

3. A method according to claim 2, wherein the step of removing a portion of said base plate comprises press cutting through said base plate to remove the portion of said base plate opposite said conductive layer.

4. A method according to claim 2, wherein the step of forming through said base plate two holes spaced a certain distance comprises forming a pair of round holes spaced the certain distance.

5. A method according to claim 4, wherein the pair of holes are formed with the distance between the pair of holes greater than a diameter of the holes, wherein the step of forming through said base plate a hole having a diameter greater than the distance between the two small holes comprises forming a large hole having a diameter greater than a diameter of the pair of holes, and wherein the step of removing a portion of said base plate opposite said conductive layer comprises press cutting said base plate along an imaginary line through said pair of holes and through said large diameter hole spaced from the portion of said conductive layer between said pair of holes to prevent said conductive layer from lifting off said base during press cutting.

6. A method according to claim 5, wherein the step of press cutting is carried out by press cutting said base along an imaginary line passing approximately through the respective centers of said pair of holes and intersecting said pair of holes so as to define an angle greater than an acute angle between the surface defining a respective one of said holes and a peripheral surface of said base plate after said base plate is press cut.

7. A method of forming an electrode on a narrow peripheral surface portion of a circuit board, comprising:
providing a base plate comprising a base for an circuit board and having a pair of opposite major surfaces and a narrow peripheral surface extending between said major surfaces, and a pair of metallic layers each disposed on a respective major surface of said base;
forming through said base plate through holes including at least a pair of holes spaced a certain distance and a third hole having a diameter greater than the distance between the pair of holes and intersecting the pair of holes so as to form a single hole defined by a surface generally having the shape of the third hole and having a pair of indentations corresponding to the pair of holes;
through hole plating with a conductive material the entire surface of said base plate including surfaces defining the through holes through said base plate;
selectively removing portions of said metallic layers to define circuit patterns by the unremoved portions of said metallic layers; and
press cutting said base plate along an imaginary line through the single hole spaced from the portion of the surface defining the single hole having the pair of indentations so that the surface having the pair of indentations becomes a narrow peripheral surface portion of the circuit board and the conductive material thereon defines an electrode on said narrow peripheral surface portion of the circuit board.

* * * * *